United States Patent
Han et al.

(10) Patent No.: US 10,263,571 B2
(45) Date of Patent: Apr. 16, 2019

(54) PROTECTION CIRCUIT FOR AN RF POWER AMPLIFIER

(71) Applicant: Qorvo US, Inc., Greensboro, NC (US)

(72) Inventors: Hailin Han, Oak Ridge, NC (US);
Steven Alexander Brown, Summerfield, NC (US); Christopher Robert Moll, Stokesdale, NC (US); Stephen P. Bachhuber, Efland, NC (US); Robert Edwin Knapp, Hillsboro, OR (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/644,098

(22) Filed: Jul. 7, 2017

(65) Prior Publication Data
US 2018/0013392 A1 Jan. 11, 2018

Related U.S. Application Data

(60) Provisional application No. 62/359,847, filed on Jul. 8, 2016.

(51) Int. Cl.
*H03F 1/52* (2006.01)
*H02H 9/02* (2006.01)
(Continued)

(52) U.S. Cl.
CPC ............ *H03F 1/523* (2013.01); *H02H 9/02* (2013.01); *H03F 1/0205* (2013.01); *H03F 3/19* (2013.01);
(Continued)

(58) Field of Classification Search
CPC . H03F 1/52; H03F 1/526; H03F 1/544; H03F 1/548; H03F 1/523; H03F 3/72;
(Continued)

(56) References Cited

U.S. PATENT DOCUMENTS 6,525,611 B1* 2/2003 Dening ..................... H03F 1/52
330/207 P
6,990,323 B2* 1/2006 Prikhodko ............... H03F 1/302
330/285
(Continued)

OTHER PUBLICATIONS

Järvinen, Esko et al., "Bias Circuits for GaAs HBT Power Amplifiers," IEEE MTT-S International Microwave Symposium Digest, May 20-24, 2001, Phoenix, AZ, USA, IEEE, 4 pages.
(Continued)

*Primary Examiner* — Khanh V Nguyen
(74) *Attorney, Agent, or Firm* — Withrow & Terranova, P.L.L.C.

(57) ABSTRACT

An RF PA and an RF PA protection circuit are disclosed according to one embodiment of the present disclosure. The RF PA includes an RF PA bias circuit and an RF PA transistor element. The RF PA transistor element has a first current terminal and a control terminal. The RF PA protection circuit is coupled between the RF PA bias circuit and the first current terminal. The RF PA protection circuit reduces a current through the first current terminal using the RF PA bias circuit when a magnitude of a voltage at the first current terminal exceeds a protection threshold.

20 Claims, 12 Drawing Sheets

(51) Int. Cl.
*H03F 3/19* (2006.01)
*H03F 3/193* (2006.01)
*H03F 3/21* (2006.01)
*H03F 1/02* (2006.01)
*H03F 3/24* (2006.01)

(52) U.S. Cl.
CPC .............. *H03F 3/193* (2013.01); *H03F 3/21* (2013.01); *H03F 3/245* (2013.01); *H03F 2200/451* (2013.01)

(58) Field of Classification Search
CPC ......... H03F 2200/441; H03F 2200/444; H03F 2200/78; H03F 3/30
USPC .............................................. 330/207 P, 298
See application file for complete search history.

(56) References Cited

U.S. PATENT DOCUMENTS

| | | | |
|---|---|---|---|
| 7,268,990 B1* | 9/2007 | Loeb | H03F 1/52 330/279 |
| 7,876,157 B1 | 1/2011 | Kang et al. | |
| 9,306,514 B2* | 4/2016 | Kwon | H03F 1/565 |
| 9,705,452 B2* | 7/2017 | Oh | H03F 1/52 |
| 2017/0047901 A1* | 2/2017 | Kim | H03F 1/52 |

OTHER PUBLICATIONS

Karoui, Walid et al., "A protection circuit for HBT RF power amplifier under load mismatch conditions," Joint 6th International IEEE Northeast Workshop on Circuits and Systems and TAISA Conference (NEWCAS-TAISA), Jun. 22-25, 2008, Montreal, QC, Canada, IEEE, pp. 241-244.

Moh, Y.S. et al., "Linearized InGaP/GaAs HBT MMIC Power Amplifier with Active Bias Circuit," IEEE Radio and Wireless Conference, Aug. 19-22, 2001, Waltham, MA, USA, IEEE, pp. 249-252.

Zimmermann, Niklas et al., "An Over-Voltage Protection Circuit for Cmos Power Amplifiers," IEEE International Conference on Electronics, Circuits and Systems, Aug. 31-Sep. 3, 2008, St. Julien's, Malta, IEEE, pp. 161-164.

Non-Final Office Action for U.S. Appl. No. 15/804,595, dated Aug. 30, 2018, 7 pages.

* cited by examiner

PROTECTION CIRCUIT FOR AN RF POWER AMPLIFIER

RELATED APPLICATIONS

This application claims the benefit of provisional patent application Ser. No. 62/359,847, filed Jul. 8, 2016, the disclosure of which is hereby incorporated herein by reference in its entirety.

FIELD OF THE DISCLOSURE

The present invention relates to radio frequency (RF) power amplifiers (PAs) and protection circuits for RF PAs.

BACKGROUND

RF PAs are widely used in RF communications systems to amplify RF transmit signals or other RF signals. As such, RF PAs may be coupled to RF antennas or other interface circuitry. In this regard, an RF PA may be subjected to extreme conditions, such as a high Direct Current (DC) supply voltage, a high RF input power, a high voltage standing wave ratio (VSWR), the like, or any combination thereof. Such extreme conditions may damage or degrade the RF PA. Therefore, there is a need for an RF PA protection circuit that helps protect the RF PA from damaging effects of extreme conditions.

SUMMARY

An RF PA and an RF PA protection circuit are disclosed according to one embodiment of the present disclosure. The RF PA includes an RF PA bias circuit and an RF PA transistor element. The RF PA transistor element has a first current terminal and a control terminal. The RF PA protection circuit is coupled between the RF PA bias circuit and the first current terminal. The RF PA protection circuit reduces a current through the first current terminal using the RF PA bias circuit when a magnitude of a voltage at the first current terminal exceeds a protection threshold.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
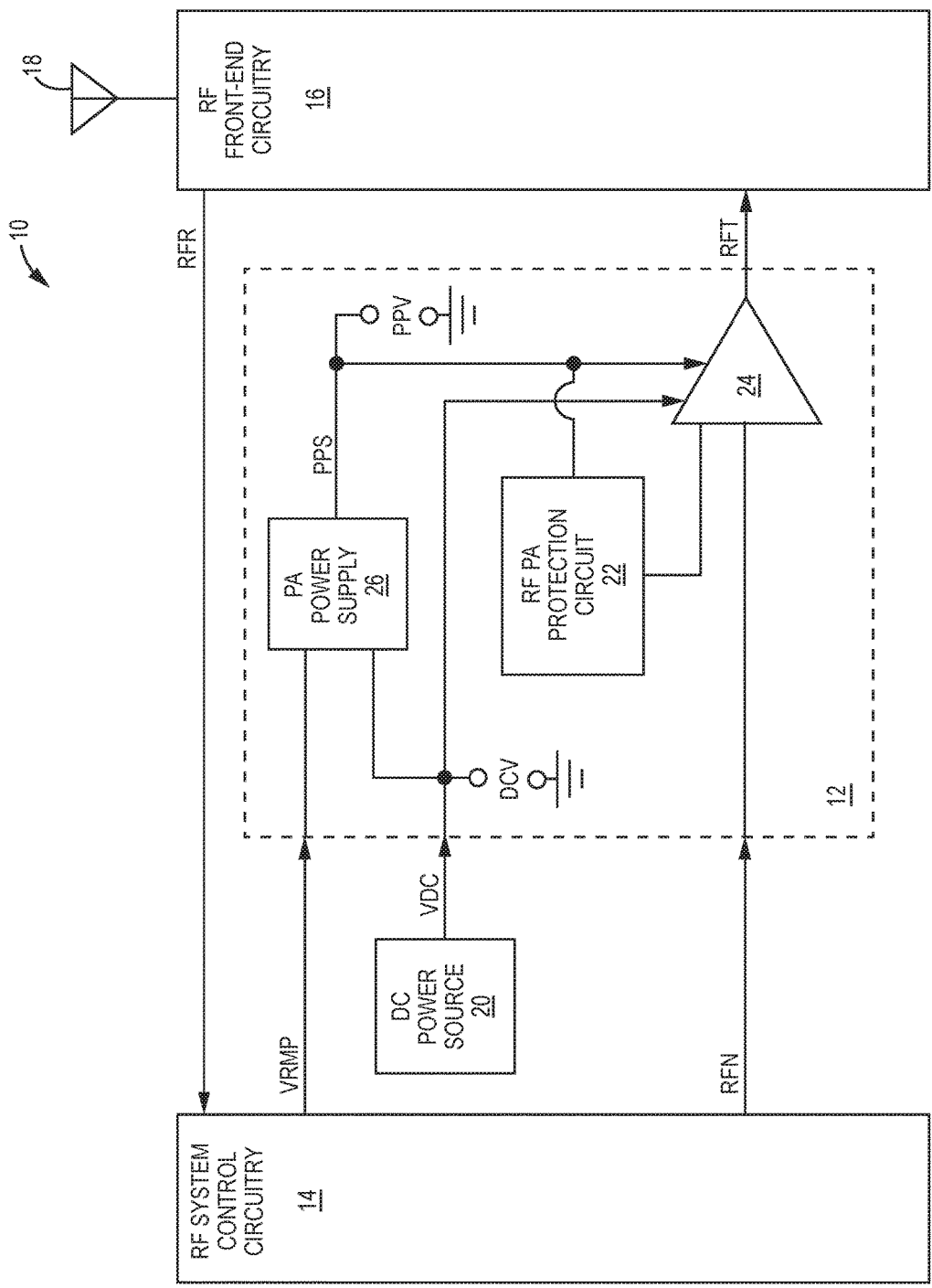
FIG. 1 shows an RF communications system according to one embodiment of the RF communications system.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

An RF PA and an RF PA protection circuit are disclosed according to one embodiment of the present disclosure. The RF PA includes an RF PA bias circuit and an RF PA transistor. The RF PA transistor has a first current terminal and a control terminal. The RF PA protection circuit is coupled between the RF PA bias circuit and the first current terminal. The RF PA protection circuit reduces a current through the first current terminal using the RF PA bias circuit when a magnitude of a voltage at the first current terminal exceeds a protection threshold.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes an RF PA protection circuit 22, an RF PA 24, and a PA power supply 26. The RF PA protection circuit 22 is coupled between the PA power supply 26 and the RF PA 24.

In one embodiment of the RF communications system 10, the RF front-end circuitry 16 receives via the RF antenna 18, processes, and forwards an RF receive signal RFR to the RF system control circuitry 14. The RF system control circuitry 14 provides a power supply control signal VRMP to the PA power supply 26. The RF system control circuitry 14 provides an RF input signal RFN to the RF PA 24. The DC power source 20 provides a DC source signal VDC to the RF PA 24 and the PA power supply 26. The DC source signal VDC has a DC source voltage DCV. In one embodiment of the DC power source 20, the DC power source 20 is a battery. As such, the DC power source 20 provides power to the PA power supply 26 via the DC source signal VDC.

The PA power supply 26 provides power to the RF PA 24 using a PA power supply signal PPS. The PA power supply signal PPS has a PA power supply voltage PPV. In one embodiment of the power supply control signal VRMP, the power supply control signal VRMP is representative of a setpoint of the PA power supply voltage PPV. The RF PA 24 receives and amplifies the RF input signal RFN to provide an RF output signal RFT using the PA power supply signal PPS. In one embodiment of the PA power supply 26, the PA power supply 26 provides power for amplification via the PA power supply signal PPS. The RF front-end circuitry 16 receives, processes, and transmits the RF output signal RFT via the RF antenna 18.

In one embodiment of the RF PA 24, the RF output signal RFT is amplitude modulated, such that the RF output signal RFT has an envelope. In one embodiment of the PA power supply 26, the PA power supply 26 modulates the PA power supply signal PPS to at least partially track the envelope of the RF output signal RFT, thereby providing envelope tracking. As such, in one embodiment of the RF system control circuitry 14, the RF system control circuitry 14 uses the power supply control signal VRMP to modulate the PA power supply signal PPS.

Figure 2:
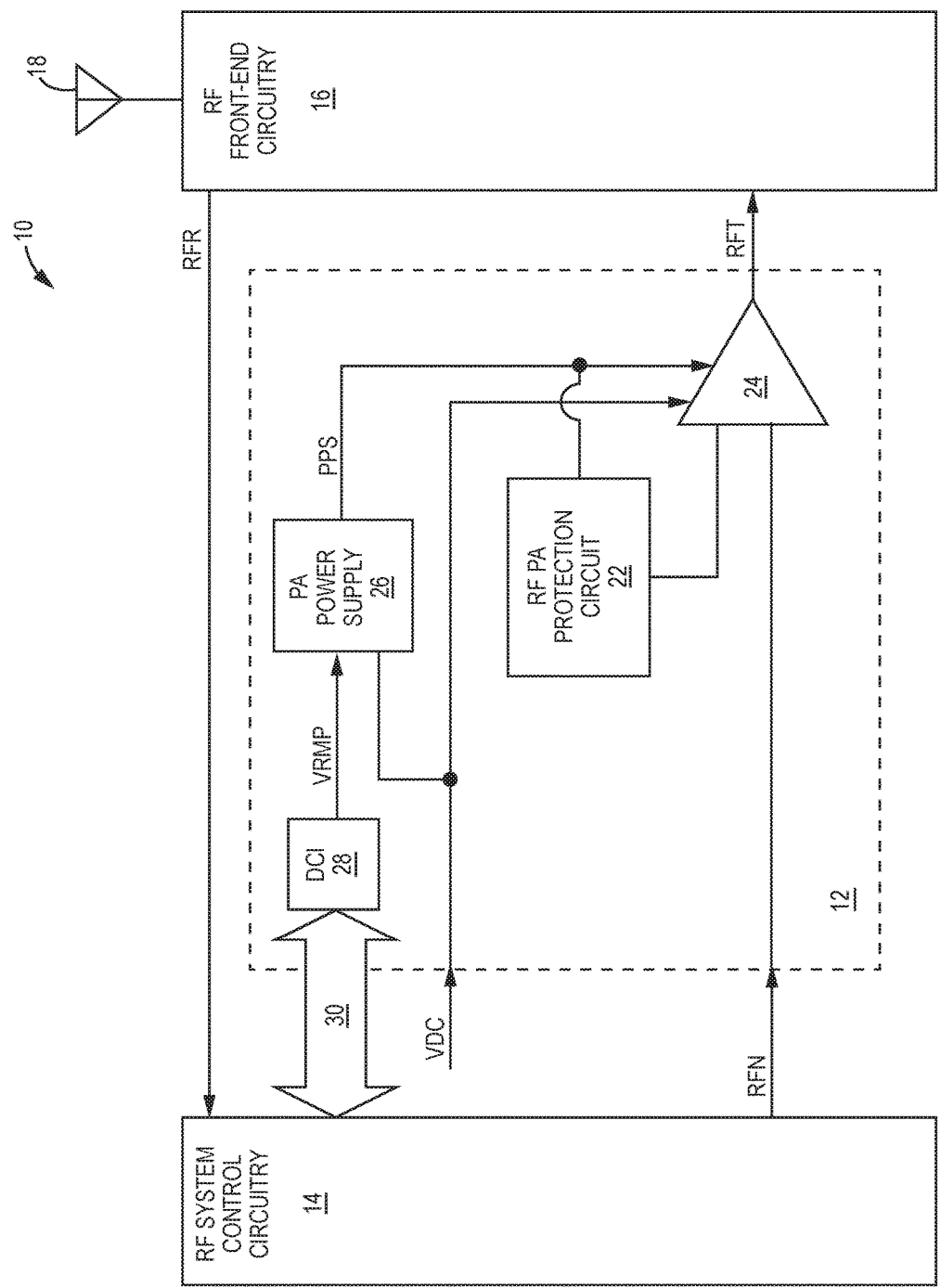
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except in the RF communications system 10 illustrated in FIG. 2, the DC power source 20 is not shown to simplify FIG. 2, and the RF transmitter circuitry 12 further includes a digital communications interface 28, which is coupled between the PA power supply 26 and a digital communications bus 30. The digital communications bus 30 is also coupled to the RF system control circuitry 14. As such, the RF system control circuitry 14 provides the power supply control signal VRMP (FIG. 1) to the PA power supply 26 via the digital communications bus 30. The DC power source 20 (FIG. 1) is not shown to simplify FIG. 2.

Figure 3:
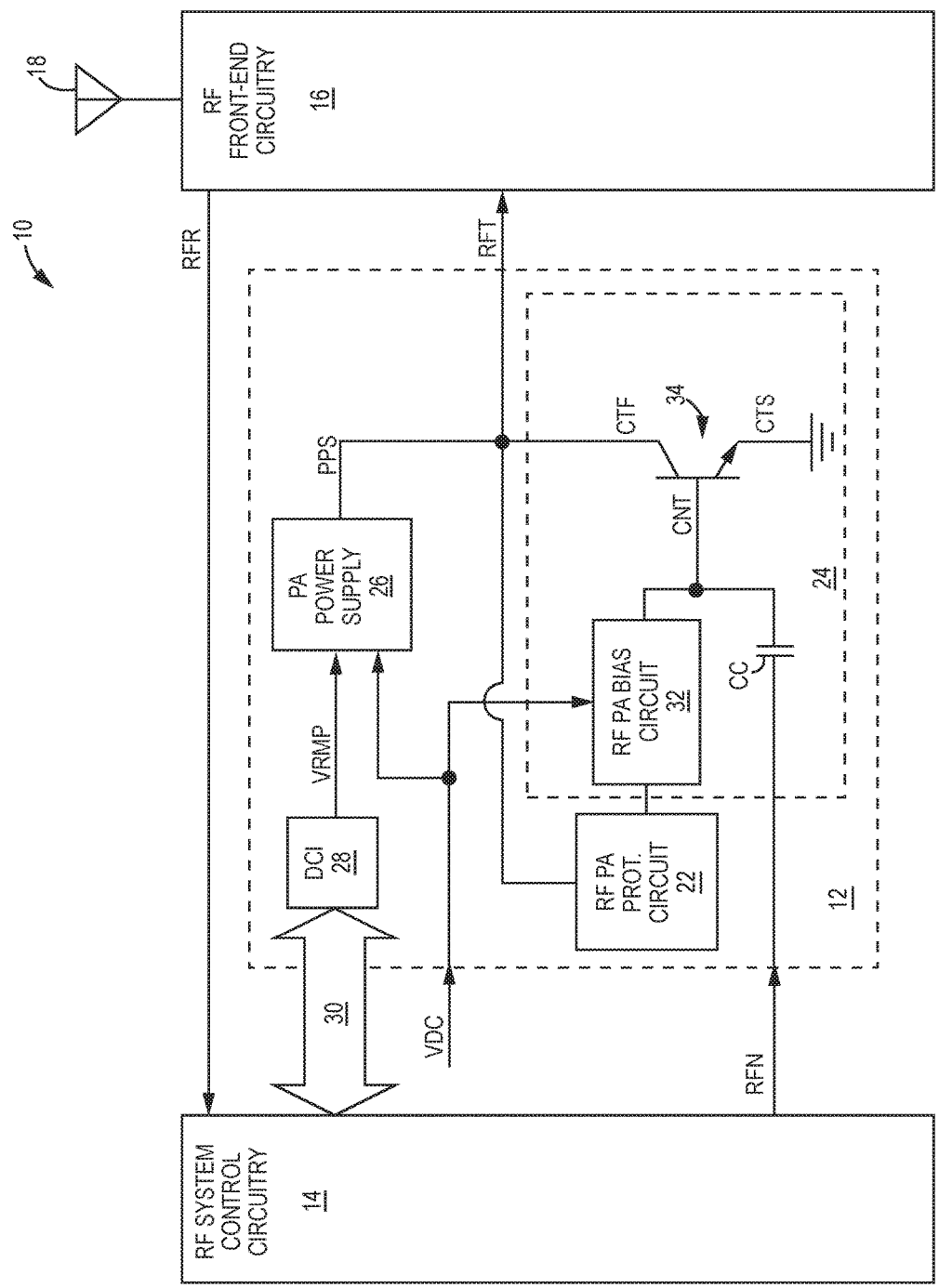
FIG. 3 shows the RF communications system according to an additional embodiment of the RF communications system.

FIG. 3 shows the RF communications system 10 according to an additional embodiment of the RF communications system 10. The RF communications system 10 illustrated in FIG. 3 is similar to the RF communications system 10 illustrated in FIG. 2, except the RF communications system 10 illustrated in FIG. 3 shows details of the RF PA 24.

In one embodiment of the RF PA 24, the RF PA 24 includes a coupling capacitive element CC, an RF PA bias circuit 32, and an RF PA transistor 34. The RF PA transistor 34 has a control terminal CNT, a first current terminal CTF, and a second current terminal CTS. The RF PA transistor 34 illustrated in FIG. 3 is an NPN bipolar junction transistor (BJT), such that the first current terminal CTF is a collector of the NPN BJT, the second current terminal CTS is an emitter of the NPN BJT, and the control terminal CNT is a base of the NPN BJT. The coupling capacitive element CC is coupled between the RF system control circuitry 14 and the RF PA transistor 34, such that the coupling capacitive element CC provides capacitive coupling between the RF system control circuitry 14 and the RF PA transistor 34. In addition, in one embodiment of the RF PA 24, the coupling capacitive element CC is coupled between the RF system control circuitry 14 and the control terminal CNT.

In one embodiment of the RF PA 24, the RF PA 24 receives and amplifies the RF input signal RFN via the coupling capacitive element CC and the control terminal CNT to provide the RF output signal RFT via the first current terminal CTF using the RF PA transistor 34. The RF PA protection circuit 22 is coupled between the RF PA bias circuit 32 and the first current terminal CTF. Further, in one embodiment of the RF PA 24, the RF PA transistor 34 receives and amplifies the RF input signal RFN via the control terminal CNT to provide the RF output signal RFT via the first current terminal CTF. Additionally, in one embodiment of the RF PA 24, the RF PA transistor 34 receives the RF input signal RFN via the coupling capacitive element CC. In one embodiment of the RF PA 24 and the PA power supply 26, the RF PA transistor 34 receives and amplifies the RF input signal RFN via the control terminal CNT to provide the RF output signal RFT using the PA power supply signal PPS, such that the PA power supply 26 provides power for amplification via the PA power supply signal PPS.

In one embodiment of the RF PA protection circuit 22 and the RF PA 24, the RF PA protection circuit 22 reduces a current through the first current terminal CTF using the RF PA bias circuit 32 when a magnitude of a voltage at the first current terminal CTF exceeds a protection threshold. Conversely, in one embodiment of the RF PA protection circuit 22 and the RF PA 24, when the magnitude of the voltage at the first current terminal CTF does not exceed the protection threshold, the RF PA bias circuit 32 biases the RF PA transistor 34 via the control terminal CNT.

In one embodiment of the RF PA 24, without the RF PA protection circuit 22, if the PA power supply voltage PPV (FIG. 1) increases rapidly, a current through the RF PA transistor 34 may also increase rapidly. This increase in current may be due to an Early voltage effect. The Early voltage effect may have been discovered by James M. Early. The increase of both voltage and current causes heating of the RF PA transistor 34, which may damage the RF PA transistor 34. Therefore, in one embodiment of the RF PA protection circuit 22 and the RF PA 24, the magnitude of the voltage at the first current terminal CTF exceeds the protection threshold when the PA power supply voltage PPV (FIG. 1) exceeds a power supply voltage threshold. As such, the RF PA protection circuit 22 reduces the current through the first current terminal CTF using the RF PA bias circuit 32, thereby reducing or preventing damage to the RF PA transistor 34.

In one embodiment of the RF PA 24, without the RF PA protection circuit 22, if a magnitude of the RF input signal RFN exceeds an RF input signal threshold, the RF PA transistor 34 may be damaged. However, in one embodiment of the RF PA protection circuit 22 and the RF PA 24, the magnitude of the voltage at the first current terminal CTF exceeds the protection threshold when the magnitude of the RF input signal RFN exceeds the RF input signal threshold. As such, that the RF PA protection circuit 22 reduces the current through the first current terminal CTF using the RF PA bias circuit 32, thereby reducing or preventing damage to the RF PA transistor 34.

In one embodiment of the RF PA 24, without the RF PA protection circuit 22, if a magnitude of a VSWR condition at the first current terminal CTF exceeds a VSWR threshold, the RF PA transistor 34 may be damaged. However, in one embodiment of the RF PA protection circuit 22 and the RF PA 24, the magnitude of the voltage at the first current terminal CTF exceeds the protection threshold when the magnitude of the VSWR condition at the first current terminal CTF exceeds the VSWR threshold. As such, that the RF PA protection circuit 22 reduces the current through the first current terminal CTF using the RF PA bias circuit 32, thereby reducing or preventing damage to the RF PA transistor 34.

In one embodiment of the RF PA 24, the RF PA bias circuit 32 is coupled between the RF PA protection circuit 22 and the RF PA transistor 34. Further, in one embodiment of the RF PA 24, the RF PA bias circuit 32 is coupled between the RF PA protection circuit 22 and the control terminal CNT. In one embodiment of the RF PA bias circuit 32, the RF PA bias circuit 32 biases the RF PA transistor 34 via the control terminal CNT. In one embodiment of the RF PA bias circuit 32, the RF PA bias circuit 32 uses the DC source signal VDC to bias the RF PA transistor 34. In one embodiment of the RF PA bias circuit 32, the RF PA bias circuit 32 uses the DC source signal VDC to bias the RF PA transistor 34 via the control terminal CNT.

In one embodiment of the RF PA transistor 34, the second current terminal CTS is coupled to ground. In this regard, the RF PA transistor 34 is coupled between the PA power supply 26 and ground via the first current terminal CTF and the second current terminal CTS. In one embodiment of the RF PA transistor 34, the second current terminal CTS is coupled directly to ground. In one embodiment of the RF PA protection circuit 22, the RF PA protection circuit 22 is coupled between the RF PA transistor 34 and the RF PA bias circuit 32. In one embodiment of the RF PA protection circuit 22, the RF PA protection circuit 22 is coupled between the first current terminal CTF and the RF PA bias circuit 32.

Figure 4:
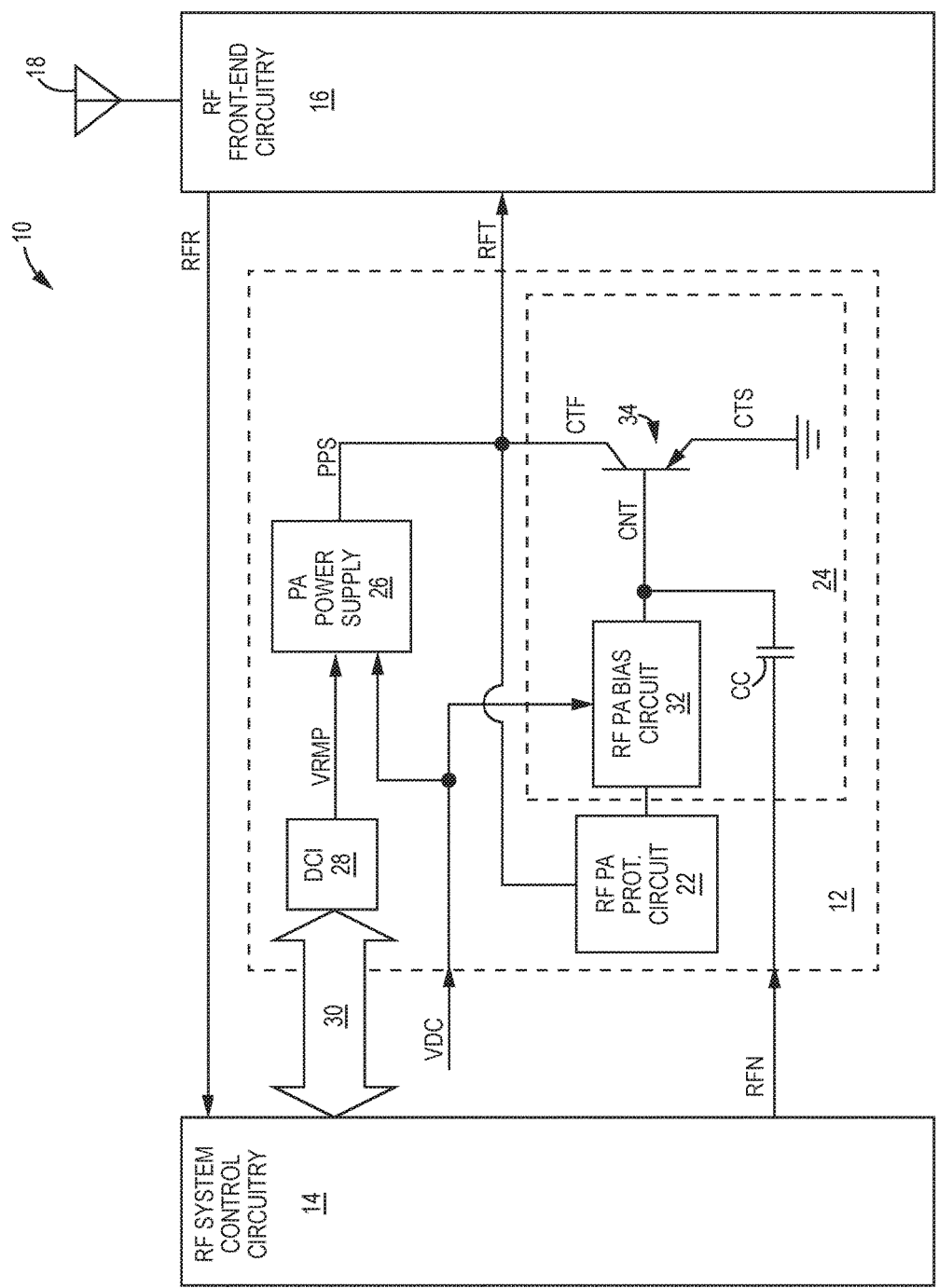
FIG. 4 shows the RF communications system according to another embodiment of the RF communications system.

FIG. 4 shows the RF communications system 10 according to another embodiment of the RF communications system 10. The RF communications system 10 illustrated in FIG. 4 is similar to the RF communications system 10 illustrated in FIG. 3, except in the RF communications system 10 illustrated in FIG. 4, the RF PA transistor 34 is a PNP BJT, such that the first current terminal CTF is a collector of the PNP BJT, the second current terminal CTS is an emitter of the PNP BJT, and the control terminal CNT is a base of the PNP BJT element.

Figure 5:
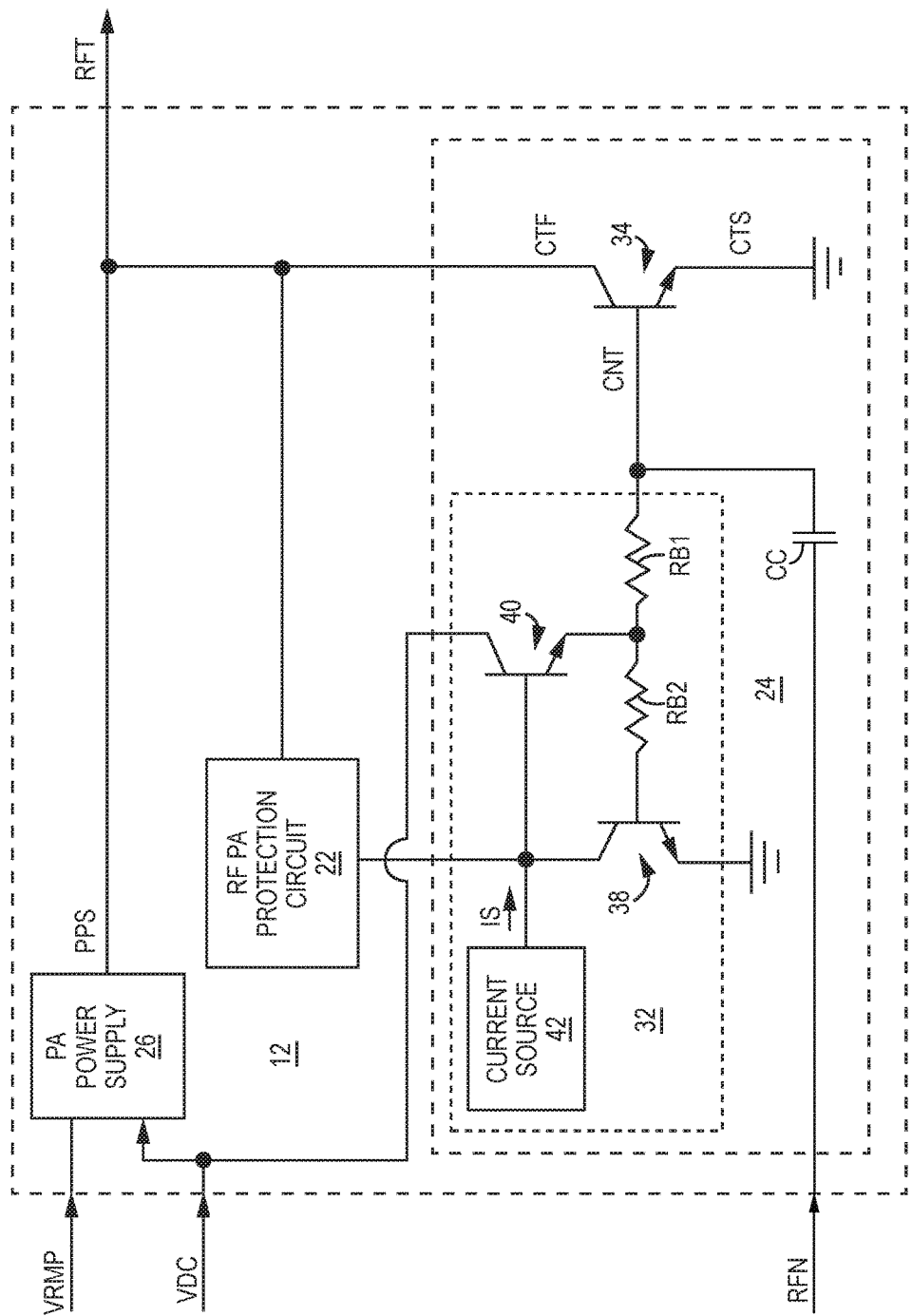
FIG. 5 shows details of the RF transmitter circuitry illustrated in FIG. 1 according to one embodiment of the RF transmitter circuitry.

FIG. 5 shows details of the RF transmitter circuitry 12 illustrated in FIG. 1 according to one embodiment of the RF transmitter circuitry 12. The RF transmitter circuitry 12 illustrated in FIG. 5 is similar to the RF transmitter circuitry 12 illustrated in FIG. 1, except in the RF transmitter circuitry 12 illustrated in FIG. 5, details of the RF PA 24, the RF PA bias circuit 32, and the RF PA transistor 34 are shown. The RF PA protection circuit 22, the RF PA transistor 34, and the coupling capacitive element CC illustrated in FIG. 5 are similar to the RF PA protection circuit 22, the RF PA transistor 34, and the coupling capacitive element CC illustrated in FIG. 3.

The RF PA transistor 34 includes the NPN BJT element. The RF PA bias circuit 32 includes a first bias transistor element 38, a second bias transistor element 40, a current source 42, a first bias resistive element RB1 and a second bias resistive element RB2. The first bias resistive element RB1 and the second bias resistive element RB2 are coupled in series between the control terminal CNT and a base of the first bias transistor element 38. An emitter of the first bias transistor element 38 is coupled to ground, and a collector of the first bias transistor element 38 is coupled to a base of the second bias transistor element 40, the RF PA protection circuit 22, and the current source 42.

In this regard, the current source 42 provides a source current IS to the collector of the first bias transistor element 38 and to a base of the second bias transistor element 40. An emitter of the second bias transistor element 40 is coupled to the first bias resistive element RB1 and the second bias resistive element RB2. A collector of the second bias transistor element 40 receives the DC source signal VDC. Under normal operating conditions, the RF PA bias circuit 32 provides a normal operating bias to the RF PA transistor 34, and the RF PA protection circuit 22 does not change operation of the RF PA bias circuit 32. However, when the when the magnitude of the voltage at the first current terminal CTF exceeds the protection threshold, the RF PA protection circuit 22 detects an abnormal operating condition and reduces the bias to the RF PA transistor 34, thereby protecting the RF PA transistor 34.

Figure 6:
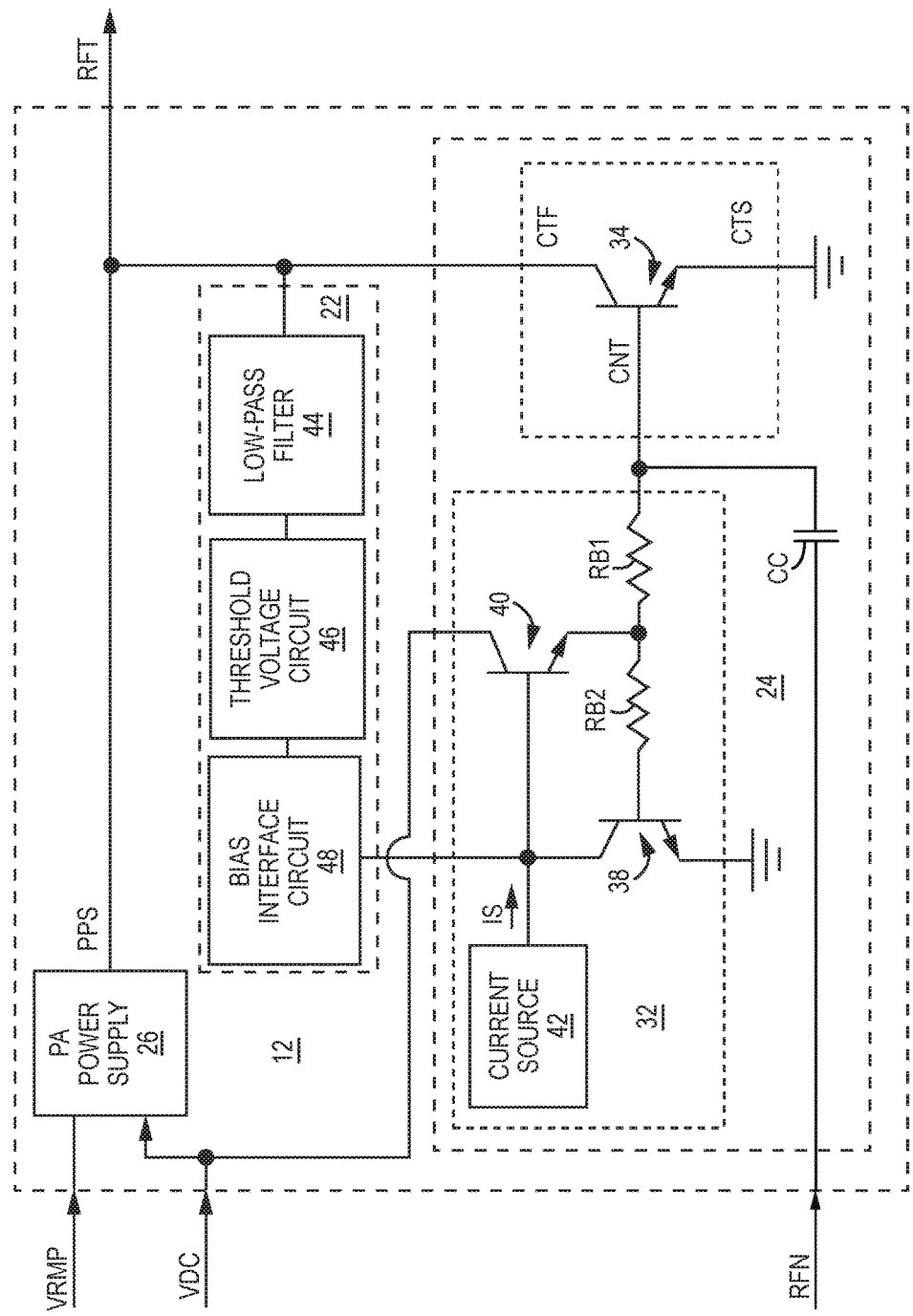
FIG. 6 shows details of the RF transmitter circuitry illustrated in FIG. 1 according to an alternate embodiment of the RF transmitter circuitry.

FIG. 6 shows details of the RF transmitter circuitry 12 illustrated in FIG. 1 according to an alternate embodiment of the RF transmitter circuitry 12. The RF transmitter circuitry 12 illustrated in FIG. 6 is similar to the RF transmitter circuitry 12 illustrated in FIG. 5, except in the RF transmitter circuitry 12 illustrated in FIG. 6, details of the RF PA protection circuit 22 are shown. The RF PA protection circuit 22 includes a low-pass filter 44, a threshold voltage circuit 46, and a bias interface circuit 48 coupled in series between the first current terminal CTF and the RF PA bias circuit 32. In an alternate embodiment of the RF PA protection circuit 22, the bias interface circuit 48 is omitted, such that the low-pass filter 44 and the threshold voltage circuit 46 are coupled in series between the first current terminal CTF and the RF PA bias circuit 32. In another embodiment of the RF PA protection circuit 22, the bias interface circuit 48 and the low-pass filter 44 are omitted, such that the threshold voltage circuit 46 is coupled between the first current terminal CTF and the RF PA bias circuit 32. In general, the low-pass filter 44 is coupled between the first current terminal CTF and the RF PA bias circuit 32. In general, the threshold voltage circuit 46 is coupled between the first current terminal CTF and the RF PA bias circuit 32. In general, the bias interface circuit 48 is coupled between the first current terminal CTF and the RF PA bias circuit 32.

Figure 7:
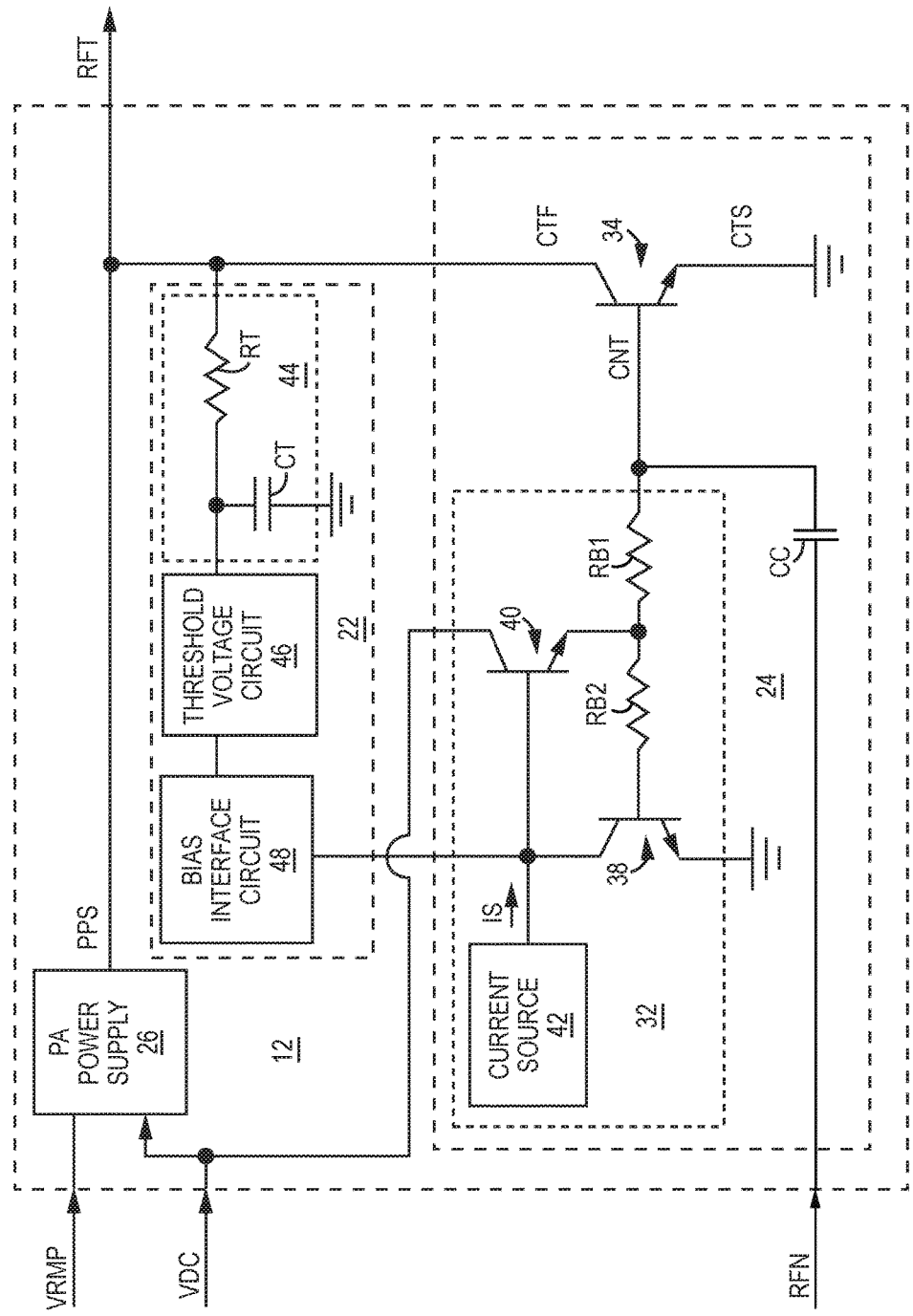
FIG. 7 shows details of the RF transmitter circuitry illustrated in FIG. 1 according to another embodiment of the RF transmitter circuitry.

FIG. 7 shows details of the RF transmitter circuitry 12 illustrated in FIG. 1 according to an alternate embodiment of the RF transmitter circuitry 12. The RF transmitter circuitry 12 illustrated in FIG. 7 is similar to the RF transmitter circuitry 12 illustrated in FIG. 6, except in the RF transmitter circuitry 12 illustrated in FIG. 7, details of the low-pass filter 44 are shown. The low-pass filter 44 includes a lowpass filter resistive element RT coupled in series between the first current terminal CTF and the RF PA bias circuit 32. The low-pass filter 44 further includes a lowpass filter capacitive element CT, such that the lowpass filter resistive element RT and the lowpass filter capacitive element CT are coupled in series between the first current terminal CTF and ground. In this regard, the lowpass filter capacitive element CT is coupled between the lowpass filter resistive element RT and ground. In one embodiment of the low-pass filter 44, a time constant of the low-pass filter 44 is short enough, such that the RF PA protection circuit 22 reacts quickly to an abnormal operating condition, thereby protecting the RF PA transistor 34. In one embodiment of the low-pass filter 44, the time constant of the low-pass filter 44 is long enough, such that the RF PA protection circuit 22 does not react to normal signal variations at the first current terminal CTF, thereby providing reliable operation of the RF PA transistor 34 under normal operating conditions.

Figure 8:
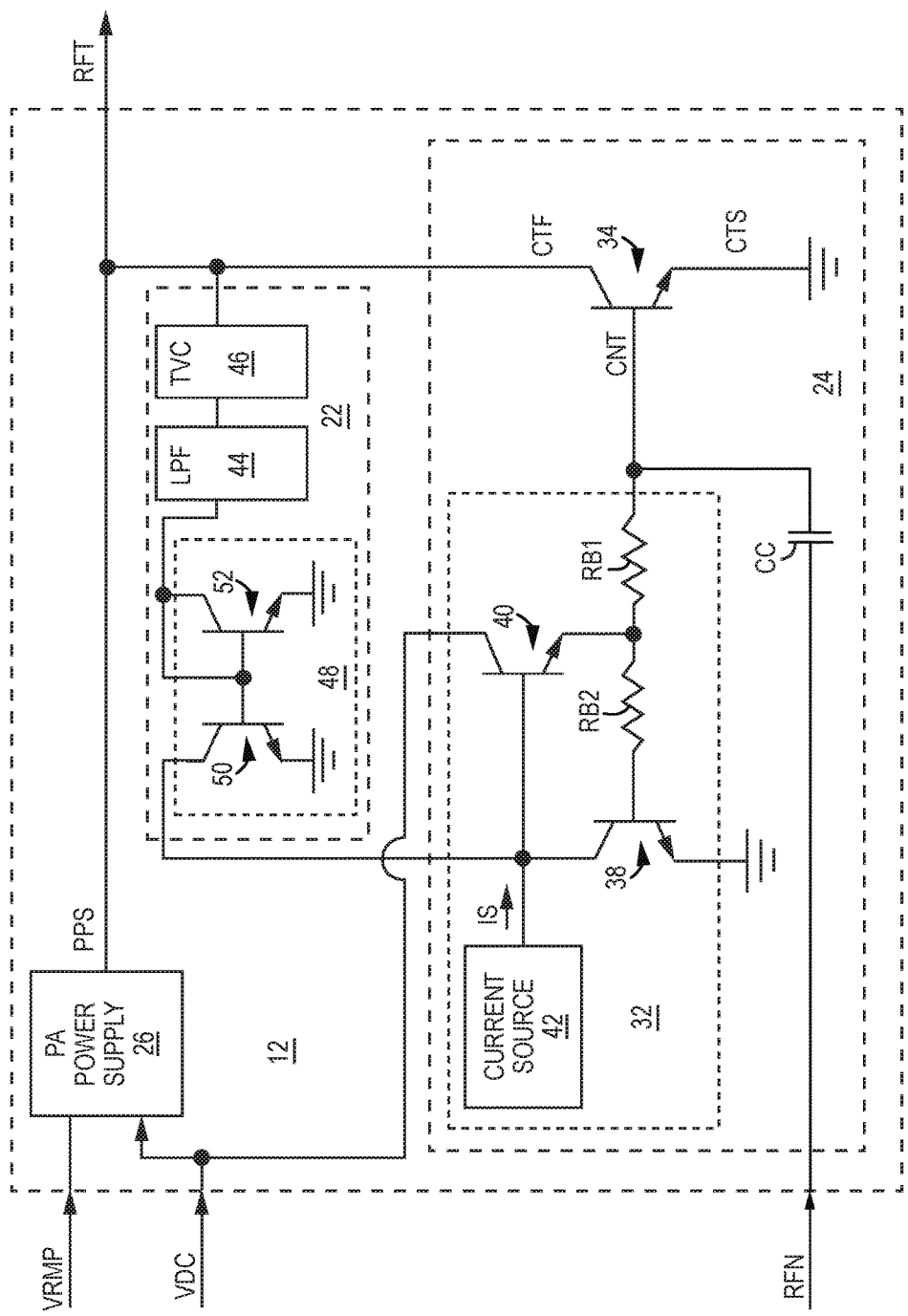
FIG. 8 shows details of the RF transmitter circuitry illustrated in FIG. 1 according to a further embodiment of the RF transmitter circuitry.

FIG. 8 shows details of the RF transmitter circuitry 12 illustrated in FIG. 1 according to an alternate embodiment of the RF transmitter circuitry 12. The RF transmitter circuitry 12 illustrated in FIG. 8 is similar to the RF transmitter circuitry 12 illustrated in FIG. 6, except in the RF transmitter circuitry 12 illustrated in FIG. 8, details of the bias interface circuit 48 are shown. The bias interface circuit 48 includes a first mirror transistor element 50 and a second mirror transistor element 52. The low-pass filter 44, the threshold voltage circuit 46, and the second mirror transistor element 52 are coupled in series between the first current terminal CTF and ground. In general, the second mirror transistor element 52 is coupled between the first current terminal CTF and ground.

The first mirror transistor element 50 is coupled between the RF PA bias circuit 32 and ground. In addition, a base of the first mirror transistor element 50 is coupled to a base and a collector of the second mirror transistor element 52, such that a current in the first mirror transistor element 50 mirrors a current in the second mirror transistor element 52. In this regard, the first mirror transistor element 50 and the second mirror transistor element 52 form a current mirror, which is coupled to the RF PA bias circuit 32. As such, the current mirror shunts current from the RF PA bias circuit 32 when the magnitude of the voltage at the first current terminal CTF exceeds the protection threshold, thereby protecting the RF PA transistor 34.

Figure 9:
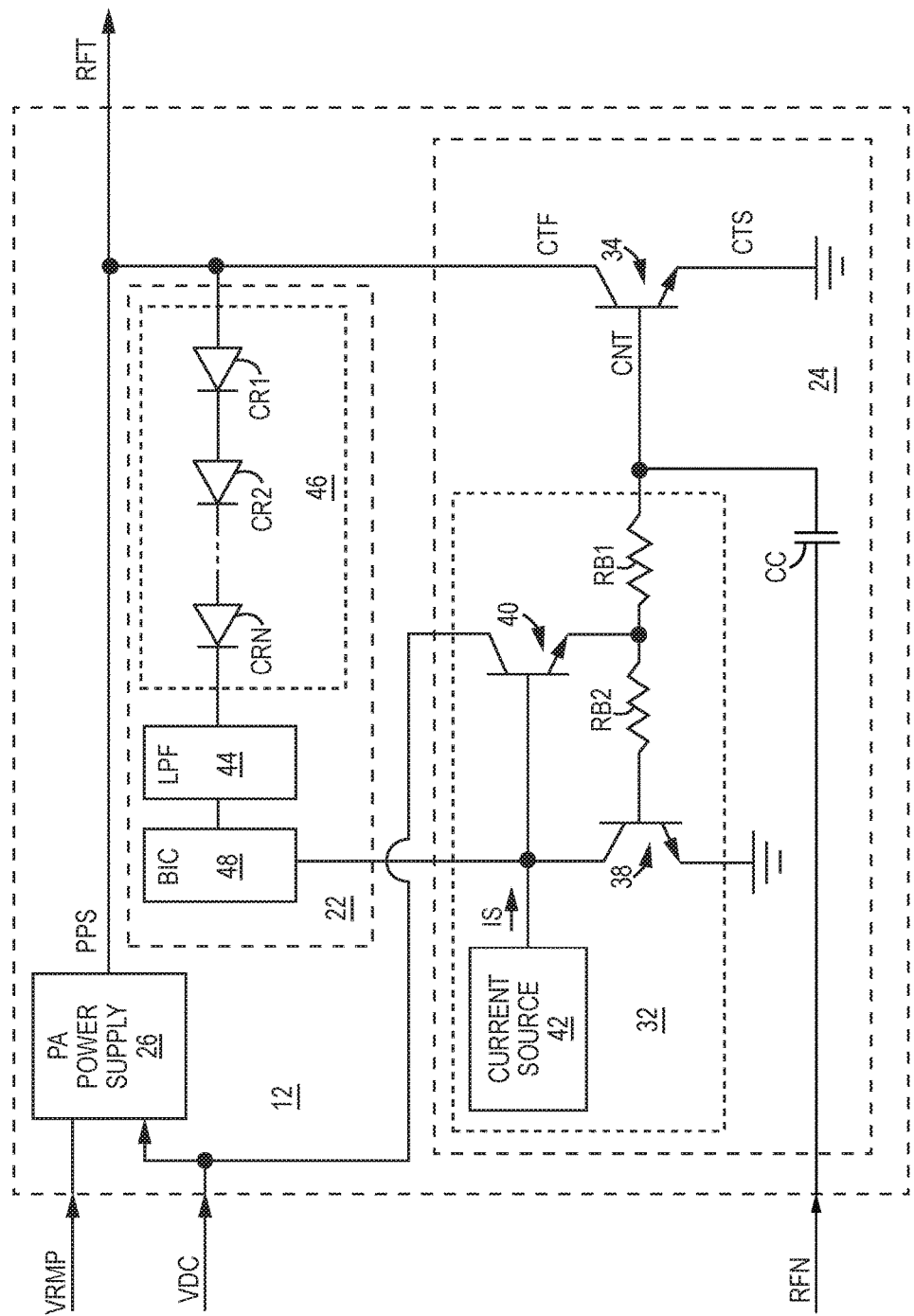
FIG. 9 shows details of the RF transmitter circuitry illustrated in FIG. 1 according to an additional embodiment of the RF transmitter circuitry.

FIG. 9 shows details of the RF transmitter circuitry 12 illustrated in FIG. 1 according to an additional embodiment of the RF transmitter circuitry 12. The RF transmitter circuitry 12 illustrated in FIG. 9 is similar to the RF transmitter circuitry 12 illustrated in FIG. 6, except in the RF transmitter circuitry 12 illustrated in FIG. 9, details of the threshold voltage circuit 46 are shown. The threshold voltage circuit 46 includes a first diode element CR1, a second diode element CR2, and up to and including an $N^{TH}$ diode element CRN coupled in series between the first current terminal CTF and the RF PA bias circuit 32. In general, the threshold voltage circuit 46 includes a group of diode elements CR1, CR2, CRN coupled in series between the first current terminal CTF and the RF PA bias circuit 32.

Figure 10:
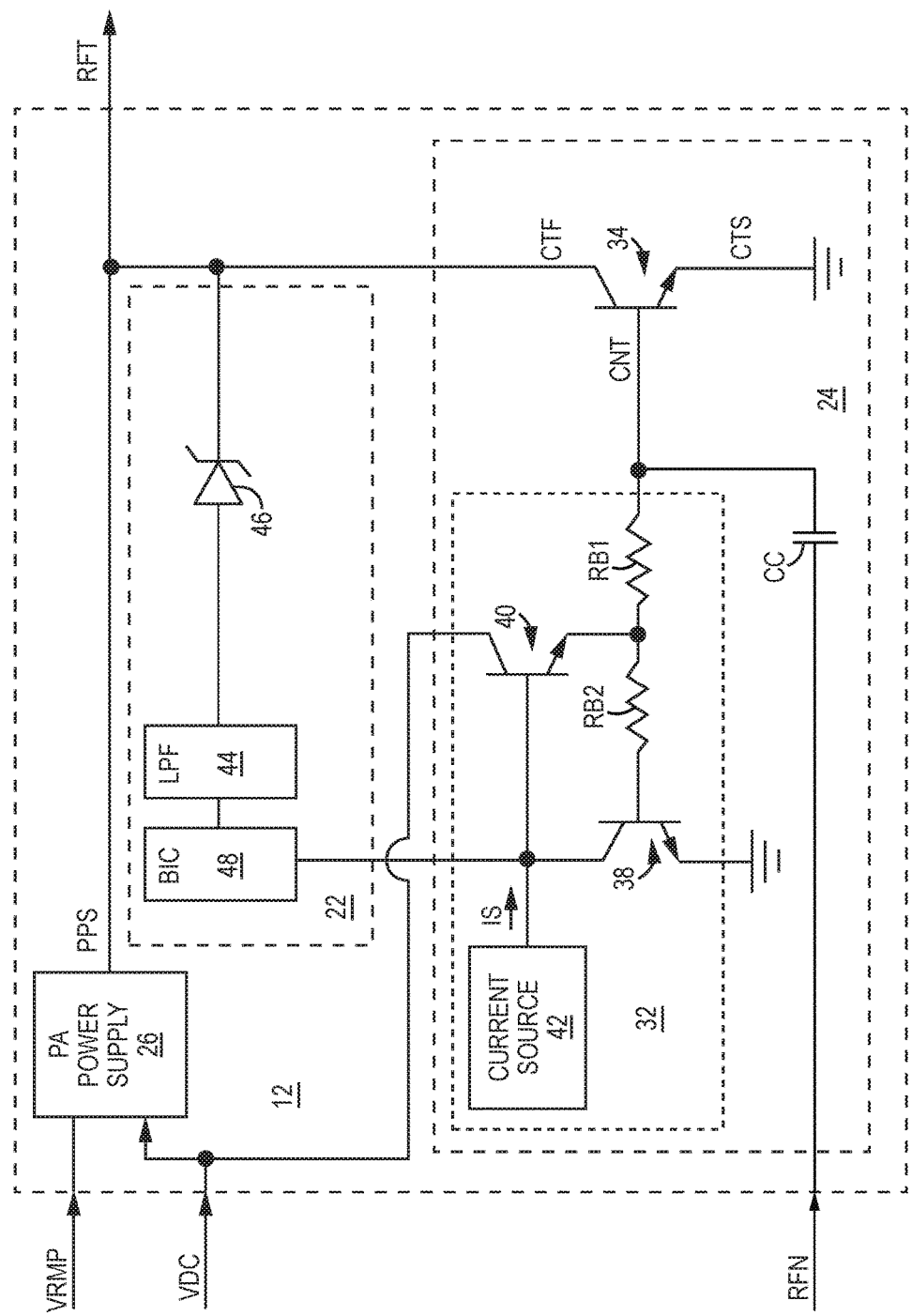
FIG. 10 shows details of the RF transmitter circuitry illustrated in FIG. 1 according to another embodiment of the RF transmitter circuitry.

FIG. 10 shows details of the RF transmitter circuitry 12 illustrated in FIG. 1 according to another embodiment of the RF transmitter circuitry 12. The RF transmitter circuitry 12 illustrated in FIG. 10 is similar to the RF transmitter circuitry 12 illustrated in FIG. 9, except in the RF transmitter circuitry 12 illustrated in FIG. 10, details of the threshold voltage circuit 46 are shown, such that the threshold voltage circuit 46 is a zener diode element coupled between the first current terminal CTF and the RF PA bias circuit 32.

Figure 11:
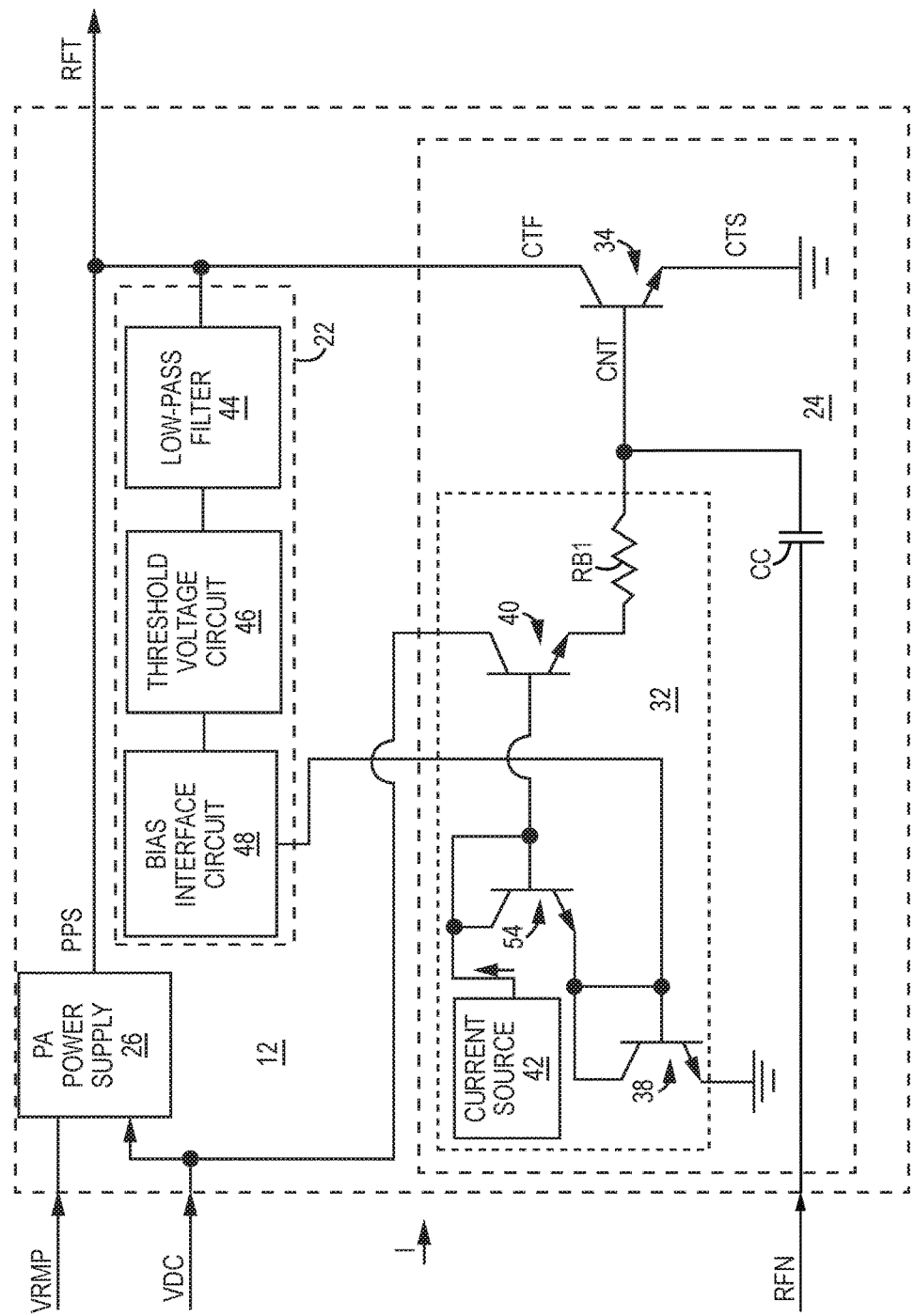
FIG. 11 shows details of the RF transmitter circuitry illustrated in FIG. 1 according to a supplemental embodiment of the RF transmitter circuitry.

FIG. 11 shows details of the RF transmitter circuitry 12 illustrated in FIG. 1 according to a supplemental embodiment of the RF transmitter circuitry 12. The RF transmitter circuitry 12 illustrated in FIG. 11 is similar to the RF transmitter circuitry 12 illustrated in FIG. 6, except in the RF transmitter circuitry 12 illustrated in FIG. 11, details of the RF PA bias circuit 32 are different from the RF PA bias circuit 32 illustrated in FIG. 6 according to one embodiment of the RF PA bias circuit 32.

In the RF PA bias circuit 32 illustrated in FIG. 11, the second bias resistive element RB2 is omitted and the RF PA bias circuit 32 further includes a third bias transistor element 54 coupled between the first bias transistor element 38 and the current source 42. Additionally, a collector and a base of the first bias transistor element 38 are coupled together and further coupled to the bias interface circuit 48.

Figure 12A:
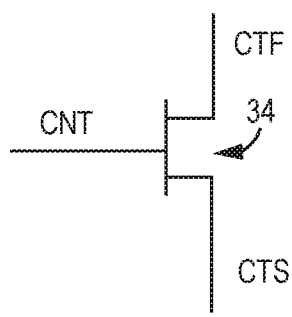
FIG. 12A shows details of an RF PA transistor illustrated in FIG. 3 according to one embodiment of the RF PA transistor.

FIG. 12A shows details of the RF PA transistor 34 illustrated in FIG. 3 according to an alternate embodiment of the RF PA transistor 34. The RF PA transistor 34 illustrated in FIG. 3 is an NPN BJT element. However, the RF PA transistor 34 illustrated in FIG. 12A is an N-type field effect transistor (NFET) element, such that the first current terminal CTF is a drain of the NFET element, the second current terminal CTS is a source of the NFET element, and the control terminal CNT is a gate of the NFET element. In one embodiment of the NFET element, the NFET element is a junction NFET element. In an alternate embodiment of the NFET element, the NFET element is a metal-oxide-semiconductor (MOS) NFET element.

Figure 12B:
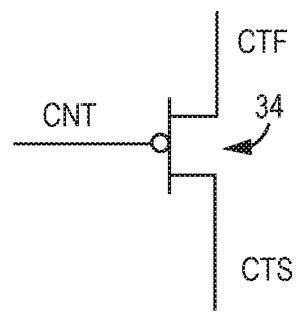
FIG. 12B shows details of the RF PA transistor illustrated in FIG. 3 according to an alternate embodiment of the RF PA transistor.

FIG. 12B shows details of the RF PA transistor 34 illustrated in FIG. 3 according to another embodiment of the RF PA transistor 34. The RF PA transistor 34 illustrated in FIG. 12B is a P-type field effect transistor (PFET) element, such that the first current terminal CTF is a drain of the PFET element, the second current terminal CTS is a source of the PFET element, and the control terminal CNT is a gate of the PFET element. In one embodiment of the PFET element, the PFET element is a junction PFET element. In an alternate embodiment of the PFET element, the PFET element is a MOS PFET element.

Those skilled in the art will recognize improvements and modifications to the preferred embodiments of the present disclosure. All such improvements and modifications are considered within the scope of the concepts disclosed herein and the claims that follow.

What is claimed is:

1. A Radio Frequency (RF) communications system comprising:
    an RF Power Amplifier (PA) protection circuit; and
    an RF PA comprising an RF PA bias circuit and an RF PA transistor element, wherein:
        the RF PA transistor element has a control terminal and a first current terminal and is configured to:
            receive an RF input signal via the control terminal; and
            amplify the RF input signal to provide an RF output signal via the first current terminal using a PA power supply signal having a PA power supply voltage;
        the RF PA protection circuit is coupled between the RF PA bias circuit and the first current terminal; and
        the RF PA protection circuit is configured to reduce a current through the first current terminal using the RF PA bias circuit via the control terminal when a magnitude of a voltage at the first current terminal exceeds a protection threshold;
        wherein the magnitude of the voltage at the first current terminal exceeds the protection threshold when the PA power supply voltage exceeds a PA power supply voltage threshold.

2. The RF communications system of claim 1 wherein when the magnitude of the voltage at the first current terminal does not exceed the protection threshold, the RF PA bias circuit is configured to bias the RF PA transistor element via the control terminal.

3. The RF communications system of claim 1 wherein the RF PA transistor element is further configured to receive the RF input signal via a coupling capacitive element.

4. The RF communications system of claim 1 wherein the magnitude of the voltage at the first current terminal exceeds the protection threshold when a magnitude of the RF input signal exceeds an RF input signal threshold.

5. The RF communications system of claim 1 wherein the magnitude of the voltage at the first current terminal exceeds the protection threshold when a magnitude of a voltage standing wave ratio (VSWR) at the first current terminal exceeds a VSWR threshold.

6. The RF communications system of claim 1 wherein the RF PA transistor element further has a second current terminal coupled to ground.

7. A Radio Frequency (RF) communications system comprising:
    an RF Power Amplifier (PA) protection circuit; and
    an RF PA comprising an RF PA bias circuit and an RF PA transistor element, wherein:
        the RF PA transistor element has a control terminal and a first current terminal;
        the RF PA protection circuit is coupled between the RF PA bias circuit and the first current terminal;
        the RF PA protection circuit is configured to reduce a current through the first current terminal using the RF PA bias circuit via the control terminal when a magnitude of a voltage at the first current terminal exceeds a protection threshold; and
        the RF PA protection circuit comprises a threshold voltage circuit comprising a diode element and coupled between the RF PA bias circuit and the first current terminal.

8. The RF communications system of claim 7 wherein the threshold voltage circuit further comprises a plurality of diode elements coupled in series between the RF PA bias circuit and the first current terminal.

9. The RF communications system of claim 7 wherein the threshold voltage circuit further comprises a zener diode element coupled between the RF PA bias circuit and the first current terminal.

10. A Radio Frequency (RF) communications system comprising:
    an RF Power Amplifier (PA) protection circuit; and
    an RF PA comprising an RF PA bias circuit and an RF PA transistor element, wherein:
        the RF PA transistor element has a control terminal and a first current terminal;
        the RF PA protection circuit is coupled between the RF PA bias circuit and the first current terminal;
        the RF PA protection circuit is configured to reduce a current through the first current terminal using the RF PA bias circuit via the control terminal when a magnitude of a voltage at the first current terminal exceeds a protection threshold; and
        the RF PA protection circuit comprises a threshold voltage circuit and a low-pass filter coupled in series between the RF PA bias circuit and the first current terminal.

11. The RF communications system of claim 10 wherein the low-pass filter comprises a lowpass filter resistive element and a lowpass filter capacitive element, such that the lowpass filter resistive element is coupled in series between the RF PA bias circuit and the first current terminal, and the lowpass filter capacitive element is coupled between the lowpass filter resistive element and ground.

12. The RF communications system of claim 1 wherein the RF PA protection circuit comprises a threshold voltage circuit, a low-pass filter, and a bias interface circuit coupled in series between the RF PA bias circuit and the first current terminal.

13. The RF communications system of claim 12 wherein the bias interface circuit comprises a current mirror coupled to the RF PA bias circuit.

14. The RF communications system of claim 1 wherein the RF PA transistor element is an NPN bipolar junction transistor (BJT) element.

15. The RF communications system of claim 1 wherein the RF PA transistor element is a PNP BJT element.

16. The RF communications system of claim 1 wherein the RF PA transistor element is an N-type field effect transistor (NFET) element.

17. The RF communications system of claim 1 wherein the RF PA transistor element is a P-type field effect transistor (PFET) element.

18. The RF communications system of claim 10 wherein the RF PA transistor element is configured to:
    receive an RF input signal via the control terminal; and amplify the RF input signal to provide an RF output signal via the first current terminal using a PA power supply signal having a PA power supply voltage, such that the magnitude of the voltage at the first current terminal exceeds the protection threshold when the PA power supply voltage exceeds a PA power supply voltage threshold.

19. The RF communications system of claim 10 wherein the threshold voltage circuit comprises a diode element.

20. The RF communications system of claim 13 wherein the current mirror is configured to shunt current from the RF PA bias circuit to ground when the magnitude of the voltage at the first current terminal exceeds the protection threshold.

* * * * *